(12) United States Patent
Moon et al.

(10) Patent No.: US 11,465,241 B2
(45) Date of Patent: Oct. 11, 2022

(54) STAGE FOR CUTTING SUBSTRATE INCLUDING REMOVABLE TUBE LINE AND SUBSTRATE-CUTTING APPARATUS THEROF

(71) Applicant: Samsung Display Co., Ltd., Yongin-si (KR)

(72) Inventors: Byeong Nam Moon, Yongin-si (KR); Yong Woo Kim, Yongin-si (KR); Ki Hong Lim, Yongin-si (KR); Kyoung Suk Kim, Yongin-si (KR); Seung Kuk Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 464 days.

(21) Appl. No.: 16/547,354

(22) Filed: Aug. 21, 2019

(65) Prior Publication Data

US 2020/0156188 A1  May 21, 2020

(30) Foreign Application Priority Data

Nov. 16, 2018  (KR) .......................... 10-2018-0141884

(51) Int. Cl.
*B23K 26/38* (2014.01)
*H01L 21/687* (2006.01)
*H01L 21/67* (2006.01)

(52) U.S. Cl.
CPC ........ *B23K 26/38* (2013.01); *H01L 21/67092* (2013.01); *H01L 21/67115* (2013.01); *H01L 21/68785* (2013.01)

(58) Field of Classification Search
CPC ................. H01L 21/683; H01L 21/687; H01L 21/68714; H01L 21/68785; H01L 21/67092; B23K 26/38
See application file for complete search history.

(56) References Cited

U.S. PATENT DOCUMENTS

| 10,005,155 | B2 | 6/2018 | Moon et al. | |
| 2017/0120379 | A1* | 5/2017 | Choi | B23K 26/38 |
| 2018/0304412 | A1* | 10/2018 | Liu | B23K 26/16 |
| 2019/0217427 | A1* | 7/2019 | Hong | B25B 11/005 |

* cited by examiner

*Primary Examiner* — John P. Dulka
(74) *Attorney, Agent, or Firm* — Lewis Roca Rothgerber Christie LLP

(57) ABSTRACT

There are provided a stage for cutting a substrate, and a substrate-cutting apparatus. The stage includes a supporting member for having the substrate mounted thereon, including a plurality of cell areas, and defining a groove line having a groove shape between the plurality of cell areas, and a first tube line inserted into the groove line to contact an inner wall of the groove line, and having an open upper portion.

19 Claims, 4 Drawing Sheets

STAGE FOR CUTTING SUBSTRATE INCLUDING REMOVABLE TUBE LINE AND SUBSTRATE-CUTTING APPARATUS THEROF

CROSS-REFERENCE TO RELATED APPLICATION

This application claims priority to, and the benefit of, Korean patent application 10-2018-0141884 filed on Nov. 16, 2018 in the Korean Intellectual Property Office, the entire disclosure of which is incorporated herein by reference.

BACKGROUND

1. Field

The present disclosure generally relates to a stage for cutting a substrate, and to a substrate-cutting apparatus.

2. Related Art

As the information age has arrived, a display field for visually displaying an electrical information signal has been rapidly developed. Accordingly, various display devices have been rapidly developed and used. Examples of such display devices include a liquid crystal display device (LCD), a field emission display device (FED), an electrophoretic display device (EPD), an electro-wetting display device (EWD), an organic light emitting display device (OLED), a quantum dot display device (QD), and the like.

A display device includes a display panel in which a display element and a driving element are located. During a manufacturing process of the display device, a plurality of display panels may be formed on a single mother substrate. In addition, the mother substrate may be mounted on a stage of a substrate-cutting apparatus, and may be cut into a plurality of cells by laser.

SUMMARY

Embodiments disclosed herein provide a stage for cutting a substrate, which includes a first tube line that has a shape corresponding to a groove line of the stage, which is inserted and mounted in the groove line, and which is detachably provided, so that a foreign substance formed at the stage can be effectively removed, and also provide a substrate-cutting apparatus.

Embodiments disclosed herein also provide a stage for cutting a substrate, which includes a first tube line that is in contact with an inner wall of a groove line of the stage to correspond to the groove line, and which is detachably provided, so that the time required to remove a foreign substance formed at the stage can be reduced, and also provide a substrate-cutting apparatus.

According to an aspect of the present disclosure, there is provided a stage for cutting a substrate, the stage including a supporting member for having the substrate mounted thereon, including a plurality of cell areas, and defining a groove line having a groove shape between the plurality of cell areas, and a first tube line inserted into the groove line to contact an inner wall of the groove line, and having an open upper portion.

The groove line and the first tube line may have a lattice shape.

The first tube line may be separable from the groove line.

The stage may further include a discharge line connected to the groove line for discharging a foreign substance from the groove line through the discharge line, wherein the first tube line has a shape corresponding to the groove line, and defines a slit line connecting an internal space of the first tube line and the discharge line.

The stage may further include a second tube line having a shape corresponding to the discharge line, the second tube line being inserted into the discharge line.

An internal space of the second tube line may be connected to the internal space of the first tube line through the slit line.

The second tube line may be integrated with the first tube line.

The supporting member may further include a plurality of dummy areas overlapping with the groove line between the plurality of cell areas, and the stage may further include a sub-tube line corresponding to the plurality of dummy areas.

The stage may further include a plurality of sub-groove lines extending in a same direction as the groove line between the plurality of dummy areas and the plurality of cell areas.

The plurality of sub-groove lines may be connected to each other below the sub-tube line.

The sub-tube line may include a plurality of openings for adsorbing the substrate.

The first tube line may be integrated with the sub-tube line.

The first tube line may further include a coating layer on a surface contacting the supporting member, wherein a frictional coefficient between the coating layer and the supporting member is smaller than a frictional coefficient between the first tube line and the supporting member.

The coating layer may include Teflon™ (Teflon is a brand name for a synthetic chemical called polytetrafluoroethylene (PTFE).

The first tube line may include a metallic material.

According to another aspect of the present disclosure, there is provided a substrate-cutting apparatus including a stage for cutting a substrate including a plurality of cells mounted on the stage, and a laser module for separating the plurality of cells by irradiating laser onto the substrate, wherein the stage includes a supporting member having a plurality of cell areas, and defining a groove line having a groove shape between the plurality of cell areas, and a first tube line inserted into the groove line to contact an inner wall of the groove line, and having an open upper portion.

The stage may further include a discharge line connected to the groove line for discharging a foreign substance from the groove line, wherein the first tube line has a shape corresponding to the groove line, and defines a slit line connecting an internal space of the first tube line and the discharge line.

The stage may further include a second tube line having a shape corresponding to the discharge line, and being inserted into the discharge line.

The supporting member may further include a plurality of dummy areas overlapping with the groove line between the plurality of cell areas, and the stage may further include a sub-tube line corresponding to the plurality of dummy areas.

BRIEF DESCRIPTION OF THE DRAWINGS

Embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
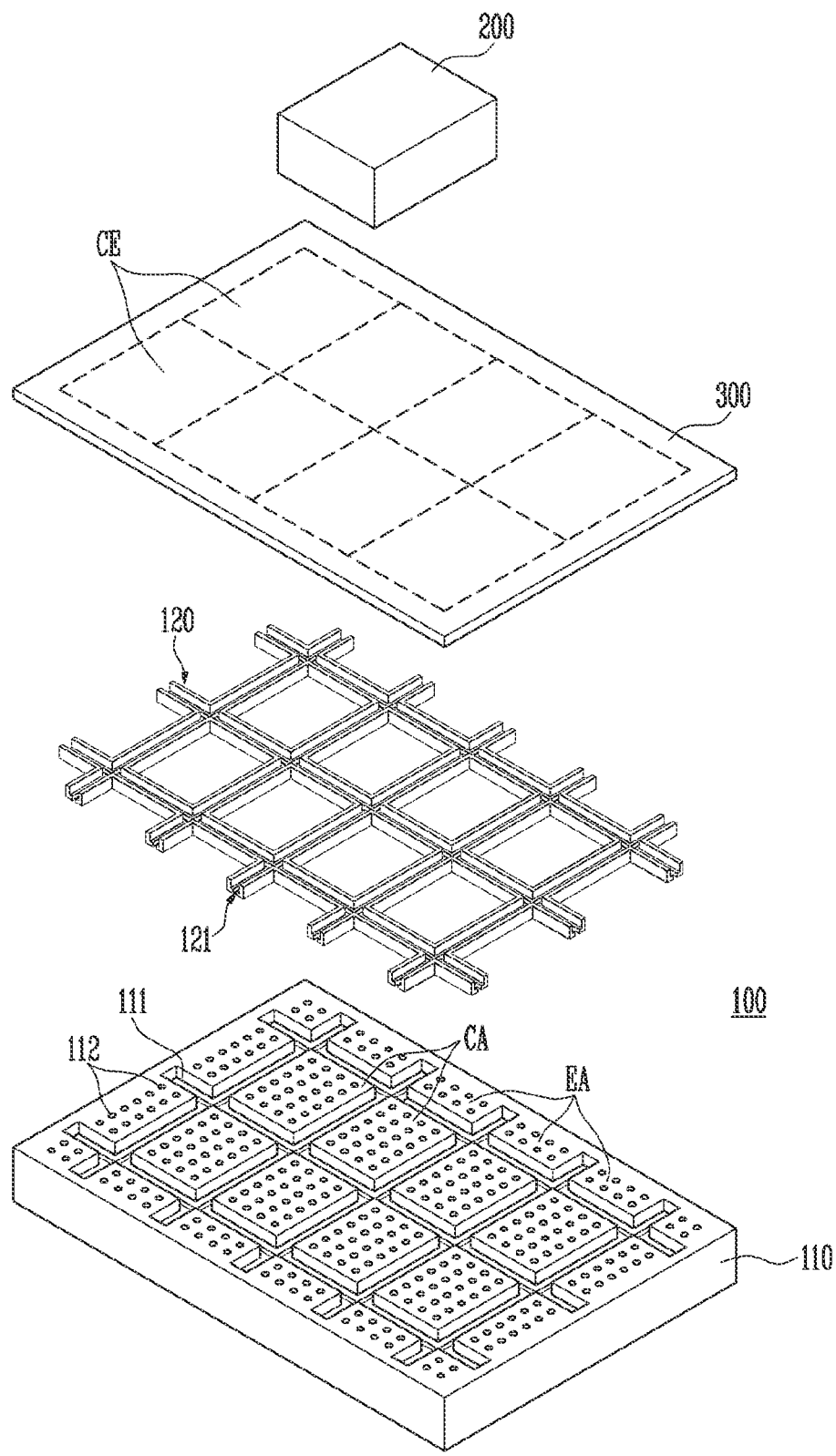
FIG. 1 is an exploded perspective view illustrating a stage for cutting a substrate, and a substrate-cutting apparatus, according to an embodiment of the present disclosure.

Aspects of the present disclosure and the way of attaining them will become apparent with reference to embodiments described below in detail in conjunction with the accompanying drawings. Embodiments, however, may be embodied in many different forms and should not be constructed as being limited to embodiments set forth herein. Rather, these embodiments are provided so that this disclosure will be through and complete and will fully convey the scope to those skilled in the art. The scope of the present disclosure should be defined by the claims.

Since the shape, size, ratio, angle, number, and the like of constituent elements illustrated in the drawings for the description of the embodiments of the present disclosure are given by way of example, the present disclosure is not limited to the illustrations. The same reference numbers will be used throughout the specification to refer to the same or like parts. In addition, in the following description of the present disclosure, a detailed description of associated known technology will be omitted when it may make the subject matter of the present disclosure rather unclear. In the case where the terms "comprises," "includes," "consists of" mentioned in this specification are used, they do not preclude the presence or addition of other constituent elements so long as the term "only" is not used. In the case where any constituent element is represented in the singular form, it is intended to include the plural forms as well unless the context clearly indicates otherwise.

In relation to the interpretation of a constituent element, the constituent element is interpreted as being characterized by an error range even if none is explicitly described.

In the case of a description related to a positional relationship, for example, when the positional relationship of two parts is described using "on," "above," "below," "beside," or the like, this means that one or more parts may be interposed between the two parts so long as the "directly" or "immediately" is not also used.

In the case of a description related to a temporal relationship, for example, when a temporal relationship is described using "after," "subsequent to," "next," "before," or the like, this means that two events may not be immediately successive so long as the term "directly" or "immediately" is not also used.

In addition, relative terms such as, for example, "first" and "second" may be used to describe various elements, the elements are not limited by these terms. The terms are merely used to distinguish any one element with another element. Thus, a first element mentioned in the following description may be a second element within the technical sprit of the present disclosure.

The respective features of the several embodiments of the present disclosure may be partially or wholly coupled or combined with one another, and various technical linkages and connections therebetween are possible. The respective embodiments may be implemented independently of one another, or may be implemented in conjunction with one another.

Reference will now be made in detail to exemplary embodiments of the present disclosure, examples of which are illustrated in the accompanying drawings.

Figure 2:
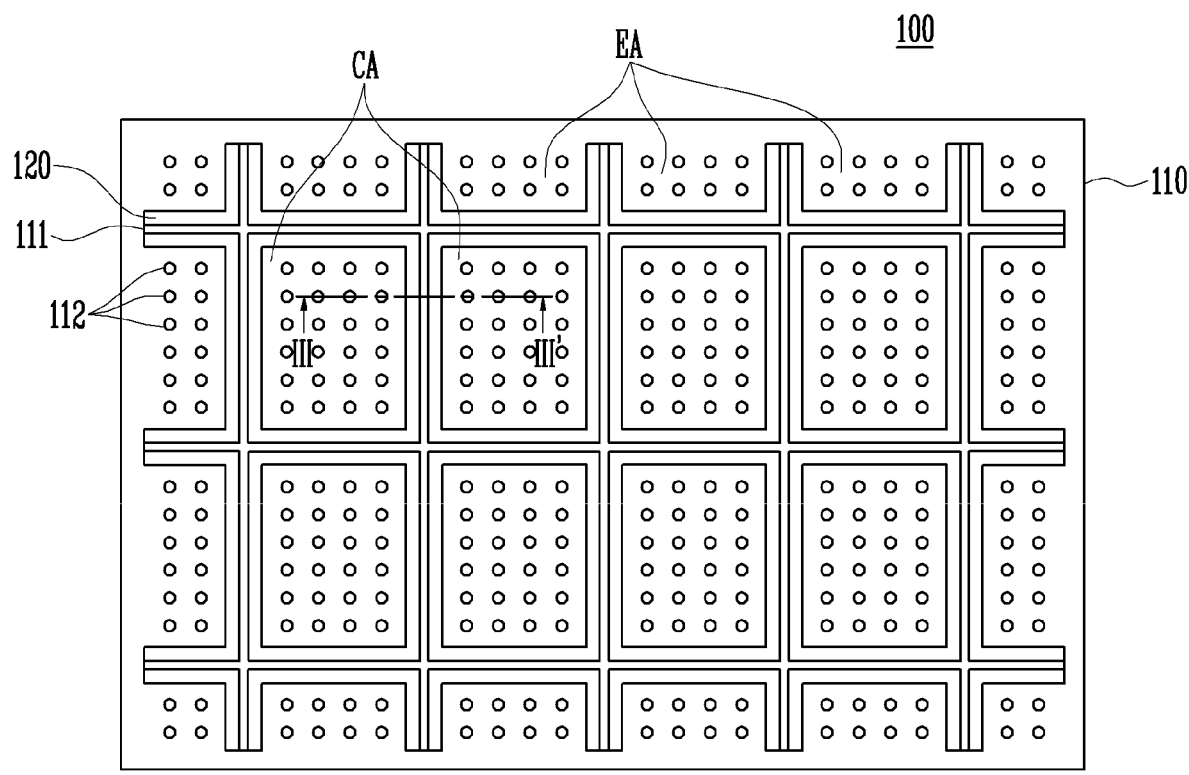
FIG. 2 is a plan view illustrating the stage and the substrate-cutting apparatus according to the embodiment of the present disclosure.
Figure 3:
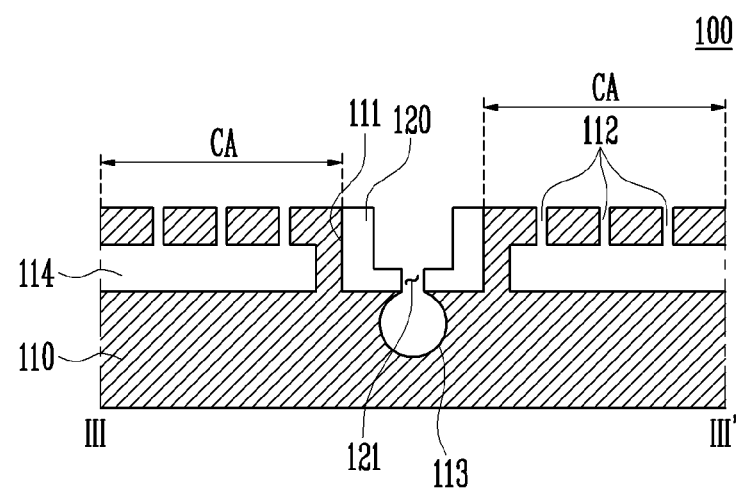
FIG. 3 is a sectional view taken along the line III-III' of FIG. 2.

FIG. 1 is an exploded perspective view illustrating a stage for cutting a substrate, and a substrate-cutting apparatus, according to an embodiment of the present disclosure. FIG. 2 is a plan view illustrating the stage and the substrate-cutting apparatus according to the embodiment of the present disclosure. FIG. 3 is a sectional view taken along the line III-III' of FIG. 2.

Referring to FIG. 1, the substrate-cutting apparatus 1000 is an apparatus for cutting a substrate 300 into a plurality of cells CE. The substrate-cutting apparatus 1000 includes a stage 100 on which the substrate 300 is mounted, and a laser module 200 above the stage 100.

Referring to FIGS. 1 to 3, the substrate 300 that is cut by the substrate-cutting apparatus 1000 may be a mother substrate having a size from which the plurality of cells CE can be formed. The substrate 300 may be made of glass or a plastic material having flexibility. For example, the substrate 300 may be made of a plastic material such as polyimide. However, the present disclosure is not limited thereto. In a manufacturing process of a display device, a plurality of display panels may be formed by forming a plurality of cells CE on the substrate 300, and by cutting the substrate 300 in units of cells CE so as to reduce time for performing the process. The plurality of cells CE may be formed on the substrate 300 to constitute a plurality of rows and columns of cells CE.

The substrate 300 may be mounted on the stage 100 of the substrate-cutting apparatus 1000. Subsequently, the substrate-cutting apparatus 1000 may form display panels by cutting the substrate 300 into the plurality of cells CE, and each display panel may proceed to a next phase of the process.

The stage 100 of the substrate-cutting apparatus 1000 includes a supporting member 110 and a first tube line 120. The supporting member 110 is a component on which the substrate 300 is mounted. The supporting member 110 includes a plurality of cell areas CA, a plurality of edge areas EA, a groove line 111, a discharge line 113, a plurality of openings 112, and a communicating portion 114.

The plurality of cell areas CA are areas corresponding to the plurality of cells CE of the substrate 300 mounted on the stage 100. The substrate 300 moved onto the stage 100 may be mounted on the stage 100 to respectively correspond to the plurality of cell areas CA. The number of the plurality of cell areas CA may respectively correspond to areas of the plurality of cells CE, but is not particularly limited to the illustrated number.

The edge areas EA surround the plurality of cell areas CA at the periphery of the stage 100. The plurality of edge areas EA may correspond to a peripheral area surrounding the plurality of cells CE of the substrate 300 mounted on the stage 100.

The plurality of openings 112 and the communicating portion 114 are formed in the plurality of cell areas CA and the plurality of edge areas EA. The plurality of openings 112 are suction nozzles for sucking (e.g., vacuuming, or adhering via suction), and for fixing the substrate 300 mounted on the stage 100. The communicating portion 114 is a space that connects the plurality of openings 112 and a suction unit. The suction unit is a component for providing a suction force. For example, a respective communicating portion 114 may be formed in each of the plurality of cell areas CA, and may be formed in each of the plurality of edge areas EA. A plurality of openings 112 located in one cell area CA may be connected to one respective communicating portion 114. A plurality of openings 112 located in one edge area EA may be connected to one respective communicating portion 114. The communicating portions 114 respectively located in the plurality of cell areas CA may be connected to each other, and may be connected to one suction unit. Similarly, the communicating portions 114 respectively located in the plurality of edge areas EA may be connected to each other, and may be connected to another suction unit.

When the suction unit is driven, the suction force of the suction unit may be transferred to the bottom of the substrate 300 through the communicating portion 114 connected to the suction unit and the plurality of openings 112. Accordingly, the plurality of cells CE can be adsorbed and fixed to the top of the plurality of cell areas CA. The other area excluding the plurality of cells CE of the substrate 300 may be adsorbed and fixed to the top of the plurality of edge areas EA. After the substrate 300 is cut into the plurality of cells CE and the remaining portion, the plurality of cells and the remaining portion may be fixed onto the stage 100.

The groove line 111 is formed in the supporting member 110. The groove line 111 is a line onto which laser may be irradiated. The groove line 111 is dug to a corresponding depth from the top of the supporting member 110. The groove line 111 may be between adjacent cell areas CA, between adjacent edge areas EA, and between adjacent cell and edge areas CA and EA. The groove line 111 may be formed between the plurality of cell areas CA constituting the plurality of rows and columns to form a lattice shape. For example, the groove line 111 may extend along the periphery of the cell area CA, and may extend along between adjacent cell and edge areas CA and EA. The plurality of cell areas CA and the plurality of edge areas EA may be separated by the groove line 111.

The groove line 111 is formed in the supporting member 110, so that damage of the supporting member 110 due to laser can be reduced. For example, the laser may be irradiated along the groove line 111 of the supporting member 110, and the substrate 300 may be cut into a plurality of cells CE by the laser. When the laser is irradiated onto the groove line 111, energy applied to the supporting member 110 by the laser may be reduced. Accordingly, damage of the supporting member 110 due to the laser can be reduced, such as an unwanted groove formed in the supporting member 110.

The discharge line 113 is formed at the bottom of the groove line 111. The discharge line 113 is a passage through which a foreign substance and/or a gas, formed in the groove line 111, may be discharged. The discharge line 113 is connected to the groove line 111. Also, the discharge line 113 may be connected to a suction unit. When the suction unit connected to the discharge line 113 is driven, the suction force of the suction unit may be transferred to the discharge line 113, and the foreign substance and the gas, which exist in the groove line 111, may be discharged to the suction unit along the discharge line 113. Accordingly, remnants of a foreign substance and/or a gas, which are generated in the groove line 111 during a substrate-cutting process, that may otherwise remain on the plurality of cells CE or the supporting member 110 can be reduced.

The discharge line 113 may be formed independently from the communicating portion 114 connected to the plurality of openings 112 of the plurality of cell areas CA and/or of the plurality of edge areas EA. In addition, the suction unit connected to the discharge line 113 may be different from, and may be driven independently of, the suction unit connected to the communicating portion 114 of the plurality of cell areas CA and/or of the plurality of edge areas EA.

The first tube line 120 is located at an inner wall of the groove line 111. The first tube line 120 is a component inserted into the groove line 111. The first tube line 120 is provided in a shape corresponding to the inner wall of the groove line 111, and may have a shape of which an upper portion thereof is open. For example, bottom and outer side surfaces of the first tube line 120 may have a shape corresponding to the inner wall of the groove line 111. The first tube line 120 may be in complete/substantially complete contact with the inner wall of the groove line 111. In addition, the upper portion of the first tube line 120 may be open, and an internal space of the first tube line 120 may be connected to the outside. Accordingly, the laser can be irradiated into the internal space of the first tube line 120.

The first tube line 120 may have a shape corresponding to the groove line 111 excluding the discharge line 113. The first tube line 120 may be formed to correspond to the inner wall of the groove line 111, and a lower portion of the first tube line 120 may be open to be connected to the discharge line 113. That is, a slit line 121 may be formed in the first tube line 120 such that the groove line 111 and the discharge line 113 are connected to each other. The slit line 121 may be formed to correspond to a portion at which the groove line 111 and the discharge line 113 are connected to each other. Accordingly, a foreign substance and/or a gas, which may be generated in the groove line 111 can be moved to the suction unit through the discharge line 113 and through the slit line 121 formed in the first tube line 120.

The first tube line 120 may be formed separately from the supporting member 110 to be inserted into the groove line 111 of the supporting member 110. For example, the first tube line 120 may be formed in a lattice shape to correspond to the groove line 111 formed in the lattice shape. The first tube line 120 formed in the lattice shape may be inserted and mounted in the groove line 111 while descending from the top surface of the supporting member 110. Also, the first tube line 120 may be separated from the groove line 111.

The first tube line 120 may be made of a material that is relatively resilient to heat to avoid being damaged or deformed by heat generated by the laser. When the laser is irradiated onto the groove line 111, heat may be applied to the first tube line 120. The first tube line 120 may be made of a material that is not easily damaged by heat generated by the laser. Accordingly, the degree to which the first tube line 120 is damaged by the heat can be reduced. The first tube line 120 may be made of a metallic material. For example, the first tube line 120 may be made of aluminum, aluminum alloy, or the like. Also, the first tube line 120 of the present embodiment is not made of resin or plastic. However, the present disclosure is not limited thereto.

The laser module 200 is located above the stage 100. The laser module 200 is a component for irradiating laser onto the substrate 300 mounted on the stage 100. The laser module may be a solid-state laser, such as a ruby laser, a glass laser, an yttrium aluminum garnet (YAG) laser, or an yttrium lithium fluoride (YLF) laser, a gas-state laser, such as an excimer laser or a helium (He)-neon (Ne) laser, or a pulsed laser, but the present disclosure is not limited thereto. Although a case where the substrate 300 is cut using the laser is described in the stage 100 and the substrate-cutting apparatus 1000 according to embodiments of the present disclosure, the present disclosure is not limited thereto. For example, the substrate-cutting apparatus 1000 may instead cut the substrate 300 through a scribing process.

In a stage for cutting a substrate and a substrate-cutting apparatus according to a conventional art, the stage does not include a first tube line that is inserted in a groove line and that is in contact with an inner wall of the groove line. A foreign substance may be generated in the groove line in a process of cutting a substrate by irradiating laser onto the groove line. The foreign substance may adhere to the inner wall of the groove line. When the number of substrates cut by the substrate-cutting apparatus increases, the amount of foreign substance stuck to the inner wall of the groove line may increase. A foreign substance and/or a gas, formed in the groove line, may not be smoothly discharged through a discharge line. In addition, the foreign substance formed in the groove line may be introduced to the bottom of a plurality of cells due to a suction force applied to a plurality of openings of a plurality of cell areas. The foreign substance introduced to the bottom of the plurality of cells may adhere to the bottom of the plurality of cells, and hence the reliability of a display panel may be reduced. Therefore, in the conventional art, the foreign substance stuck to the groove line is to be periodically removed after the substrate-cutting apparatus cuts a given number of substrates. The substrate-cutting apparatus has a substrate-cutting process halted while the foreign substance that was formed in the groove line is removed therefrom. For example, the substrate-cutting process may be stopped, and the foreign substance formed in the groove line may be manually removed using a cleaning tool such as a chisel.

On the other hand, in the stage 100 and the substrate-cutting apparatus 1000 according to embodiments of the present disclosure, the first tube line 120 may be inserted into the groove line 111. The first tube line 120 may have a shape corresponding to the groove line 111. That is, the first tube line 120 may be in contact with the inner wall of the groove line 111, and may have an open upper portion. Also, the first tube line 120 may include the slit line 121 that connects the internal space of the first tube line 120 to the discharge line 113. The slit line 121 may be provided at, or defined by, the bottom of the first tube line 120. A foreign substance and/or a gas, which may be generated when the substrate 300 is cut, may be discharged to the suction unit along the slit line 121 and the discharge line 113.

Meanwhile, because the first tube line 120 is in contact with the inner wall of the groove line 111, the foreign substance formed during the process of cutting the substrate 300 may be stuck to an inner wall of the first tube line 120 instead of the inner wall of the groove line 111. The foreign substance may also stick to a portion adjacent to an upper surface of the stage 100 (e.g., to an upper portion of the inner wall of the first tube line 120). To remove the foreign substance stuck to the first tube line 120, the first tube line 120 may be separated from the groove line 111. Once the foreign substance of the first tube line 120 is removed, a new first tube line 120 may be inserted into the groove line 111. That is, a new first tube line 120 having no foreign substance may be inserted into the groove line 111 to replace the first tube line 120 from which the foreign substance is to be removed. Therefore, the substrate-cutting process of the substrate-cutting apparatus 1000 is not stopped during an entire time during which the foreign substance stuck to the first tube line 120 is removed. Instead, the substrate-cutting process is halted for a lesser amount of time during which the first tube line 120 in which the foreign substance exists is replaced with a new first tube line 120.

The time for the first tube line 120 to be replaced with a new first tube line 120 may be remarkably shorter than the time for manually removing the foreign substance formed in the groove line in the conventional art. Thus, the time for which the substrate-cutting process is stopped to remove the foreign substance can be reduced. For example, based on a certain period, the time for which the substrate-cutting process is stopped to remove the foreign substance formed in the groove line 111 may be decreased to 0.6% from 2.4% in the conventional art. Thus, the number of substrates 300 that are able to be cut by the substrate-cutting apparatus 1000 for a certain time can increase, and the efficiency of the substrate-cutting apparatus 1000 can be improved.

Figure 4:
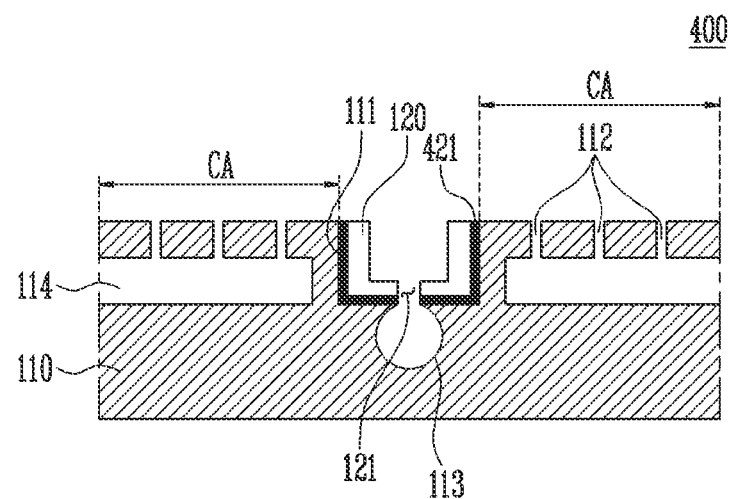
FIG. 4 is a sectional view illustrating a stage for cutting a substrate, and a substrate-cutting apparatus, according to another embodiment of the present disclosure.

FIG. 4 is a sectional view illustrating a stage for cutting a substrate, and a substrate-cutting apparatus, according to another embodiment of the present disclosure. The stage 400 and the substrate-cutting apparatus, which are shown in FIG. 4, are configured identically to the stage 100 and the substrate-cutting apparatus 1000 of FIGS. 1 to 3, except that a coating layer 421 is further included, and therefore, repeated or overlapping descriptions will be omitted.

Referring to FIG. 4, the first tube line 120 includes the coating layer 421 located on a surface in contact with the supporting member 110. The coating layer 421 is a layer coated on the surface of the first tube line 120 at a contact surface between the first tube line 120 and the supporting member 110. The coating layer 421 is formed on the bottom and outer side surfaces of the first tube line 120. The first tube line 120 may avoid direct contact with the supporting member 110 due to the coating layer 421.

A frictional coefficient between the coating layer 421 and the supporting member 110 may be smaller than a frictional coefficient between the first tube line 120 and the supporting member 110. Therefore, a frictional force between the first tube line 120 and the supporting member 110 may be greater than a frictional force between the coating layer 421 and the supporting member 110. For example, the first tube line 120 may be made of aluminum, and the coating layer 421 may be made of Teflon™ (Teflon is a brand name for a synthetic chemical called polytetrafluoroethylene (PTFE). However, the present disclosure is not limited thereto.

In the stage 400 and the substrate-cutting apparatus according to the present embodiment of the present disclosure, the first tube line 120 includes the coating layer 421 located on the surface in contact with the supporting member 110. In a process in which the first tube line 120 is mounted on the groove line 111 by descending at the top of the supporting member 110 (e.g., by lowering the first tube line 120 into the groove line 111), the first tube line 120 may not be in direct contact with the supporting member 110.

Instead, the coating layer 421 formed on the surface of the first tube line 120 may be in contact with the supporting member 110. The frictional coefficient between the first tube line 120 and the supporting member 110 may be greater than that between the coating layer 421 and the supporting member 110. Accordingly, as compared with a case where the coating layer 421 is omitted, the force required to insert or separate the first tube line 120 into or from the groove line 111 can be reduced. The first tube line 120 can be smoothly mounted on, or separated from, the groove line 111.

Figure 5:
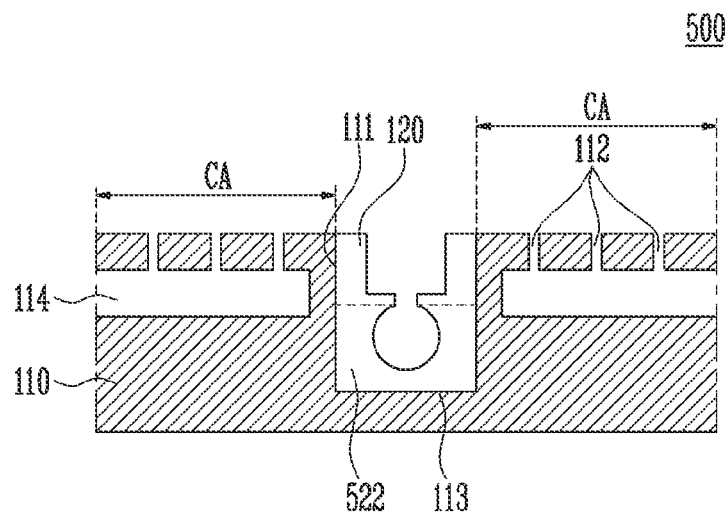
FIG. 5 is a sectional view illustrating a stage for cutting a substrate and a substrate-cutting apparatus according to still another embodiment of the present disclosure.

FIG. 5 is a sectional view illustrating a stage for cutting a substrate and a substrate-cutting apparatus according to still another embodiment of the present disclosure. The stage 500 and the substrate-cutting apparatus, which are shown in FIG. 5, are configured identically to the stage 100 and the substrate-cutting apparatus 1000 of FIGS. 1 to 3, except that a second tube line 522 is further included, and therefore, repeated overlapping descriptions will be omitted.

Referring to FIG. 5, the second tube line 522 is a component inserted into, or defining, the discharge line 113. The second tube line 522 is provided in a shape corresponding to the discharge line 113, and may have a shape of which an upper portion of the second tube line 522 is open. For example, bottom and side surfaces of the second tube line 522 may correspond to an inner wall of the discharge line 113. The second tube line 522 may be in complete contact with the inner wall of the discharge line 113. In addition, an upper portion of the second tube line 522 may be open, and the internal space of the first tube line 120 and an internal space of the second tube line 522 may be connected to each other through the slit line 121. Therefore, a foreign substance and/or a gas, which may be formed in the internal space of the first tube line 120, may be moved to the internal space of the second tube line 522 through the slit line 121, and the foreign substance and/or the gas in the internal space of the second tube line 522 may be moved to the suction unit.

The second tube line 522 may be formed separately from the supporting member 110 to be inserted into the discharge line 113 (e.g., into an area of the supporting member 110 corresponding to the discharge line 113). The second tube line 522 may be formed in a lattice shape to correspond to the discharge line 113 formed in a lattice shape. The second tube line 522 in the lattice shape may be inserted and mounted in the discharge line 113 by descending at the top of the supporting member 110 (e.g., by being lowered into grooves defined by the supporting member 110). Also, the second tube line 522 may be separated from the supporting member 110.

The second tube line 522 may be made of a metallic material. For example, the second tube line 522 may be made of aluminum, aluminum alloy, etc. Also, the second tube line 522 of the present embodiment is not made of resin or plastic. The second tube line 522 may be made of the same material as the first tube line 120. However, the present disclosure is not limited thereto.

The second tube line 522 may be integrally provided with the first tube line 120. The integrated first and second tube lines 120 and 522 may be inserted into the discharge line 113 and the groove line 111 (e.g., may be inserted into portions of the supporting member 110 corresponding to the discharge line 113 and the groove line 111), and may be mounted while being in contact with the inner walls of the discharge line 113 and the groove line 111/inner walls of the supporting member 110. Also, the integrated first and second tube lines 120 and 522 may be separated from the supporting member 110. The second tube line 522 may be made of the same material as the first tube line 120, and be made of, for example, aluminum. Meanwhile, although a case where the second tube line 522 is integrated with the first tube line 120 is described in the above, the present disclosure is not limited thereto. That is, the second tube line 522 may be a component that is separate from the first tube line 120 in other embodiments. For example, after the second tube line 522 is inserted into the discharge line 113, the first tube line 120 may be inserted into the groove line 111.

The stage 500 and the substrate-cutting apparatus according to the present embodiment includes the second tube line 522 that is inserted into the discharge line 113, and that is integrated with the first tube line 120. A foreign substance formed in the process of cutting the substrate 300 may be stuck to the inner walls of the first tube line 120 and the second tube line 522. To remove the foreign substance stuck to the first tube line 120 and the second tube line 522, the first tube line 120 and the second tube line 522 may be separated from the supporting member 110, and a new first tube line 120 and a new second tube line 522 may be respectively inserted into the groove line 111 and the discharge line 113. Therefore, the substrate-cutting process of the substrate-cutting apparatus need not be stopped for an entirety of a time for which the foreign substance formed in the first tube line 120 and/or the second tube line 522 is removed. The substrate-cutting process may instead be paused for only a time during which the first tube line 120 and the second tube line 522, in which the foreign substance exists, are replaced with a new first tube line 120 and a new second tube line 522. Thus, the time required to stop the substrate-cutting process so as to remove the foreign substance formed in the groove line 111 and the discharge line 113 can be reduced. Thus, the number of substrates 300 that are able to be cut by the substrate-cutting apparatus during a certain time can increase, and the efficiency of the substrate-cutting apparatus can be improved.

Figure 6:
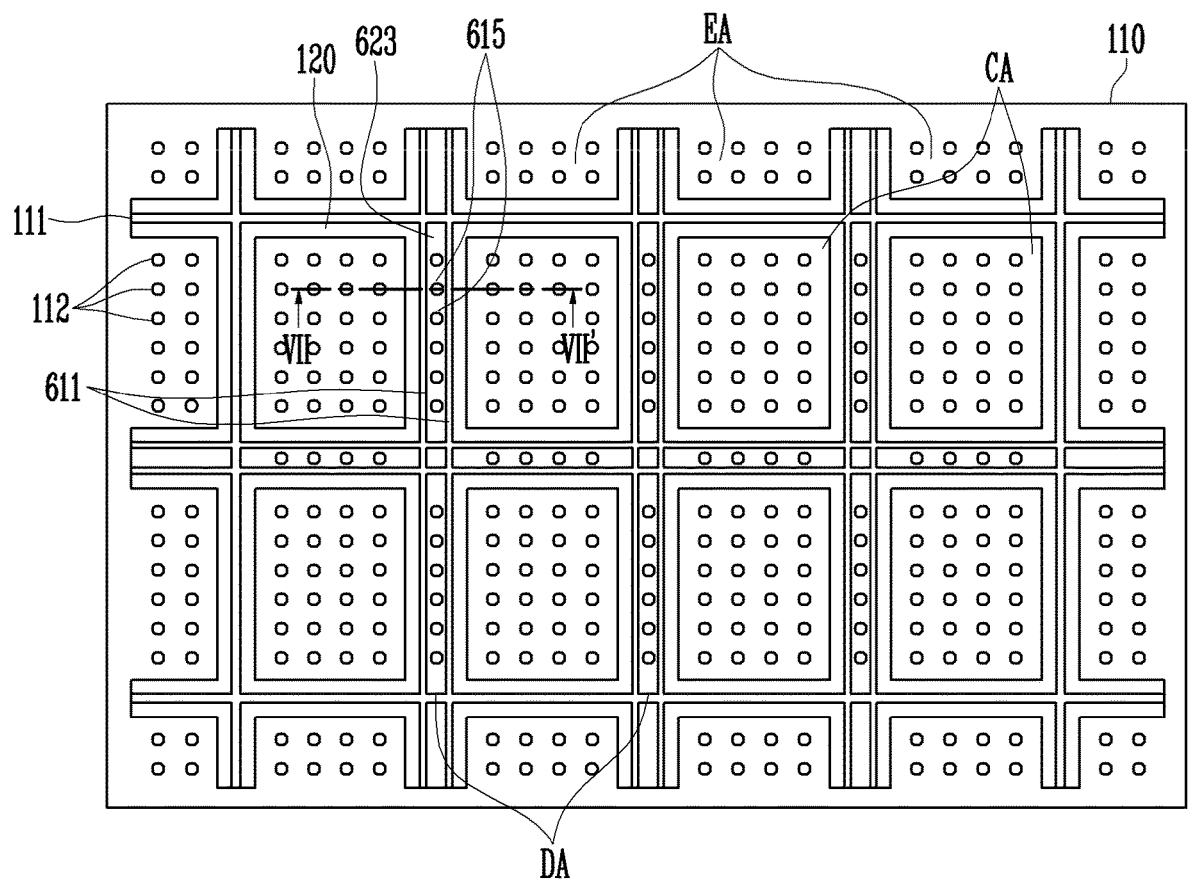
FIG. 6 is a plan view illustrating a stage for cutting a substrate, and a substrate-cutting apparatus, according to still another embodiment of the present disclosure.
Figure 7:
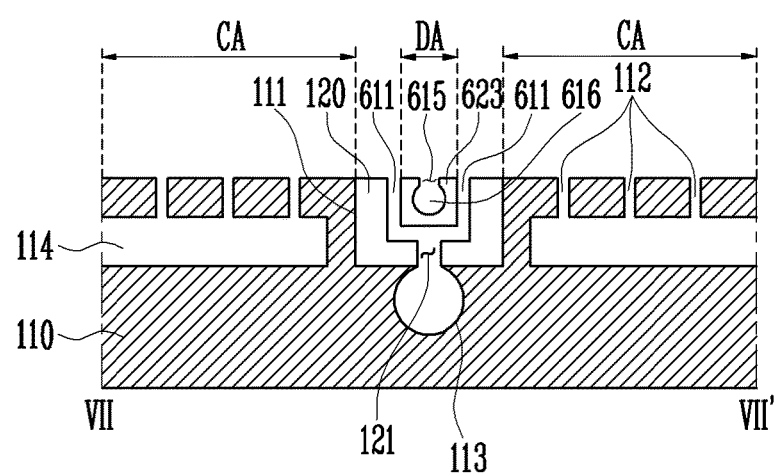
FIG. 7 is a sectional view taken along the line VII-VII' of FIG. 6.

FIG. 6 is a plan view illustrating a stage for cutting a substrate, and a substrate-cutting apparatus, according to still another embodiment of the present disclosure. FIG. 7 is a sectional view taken along the line VII-VII' of FIG. 6.

The stage 600 and the substrate-cutting apparatus, which are shown in FIGS. 6 and 7, are configured identically to the stage 100 and the substrate-cutting apparatus 1000 of FIGS. 1 to 3, except that a dummy area DA and a sub-tube line 623 are further included, and therefore, overlapping descriptions will be omitted.

Referring to FIGS. 6 and 7, the substrate-cutting apparatus includes the stage 600, and the stage 600 may include a supporting member 110, a first tube line 120, and the sub-tube line 623.

The supporting member 110 includes a plurality of cell areas CA, a plurality of edge areas EA, a plurality of dummy areas DA, a groove line, a discharge line 113, a plurality of openings 112 and 615, and communicating portions 114 and 616.

The plurality of cell areas CA are areas corresponding to a plurality of cells CE of a substrate 300 mounted on the stage 600. The plurality of edge areas EA are areas surrounding the plurality of cell areas CA at the periphery of the stage 600.

A plurality of openings 112 for sucking and fixing the substrate 300 are formed in the plurality of cell areas CA and the plurality of edge areas EA. The plurality of openings 112 is connected to a communicating portion 114. The communicating portion 114 is a space that connects the plurality of openings 112 to a suction unit. When the suction unit is driven, the suction force of the suction unit may be transferred to the bottom of the substrate 300 through the communicating portion 114 and the plurality of openings 112. The substrate 300 may be adsorbed and fixed to the plurality of cell areas CA and the plurality of edge areas EA.

The groove line 111 is between the plurality of cell areas CA, between the plurality of edge areas EA, and between cell and edge areas CA and EA, and is dug from, or recessed from, the top of the supporting member 110. The groove line may be formed in a lattice shape.

The discharge line 113 is formed at the bottom of the groove line 111. The discharge line 113 is a passage through which a foreign substance and/or a gas, which may be formed in the groove line 111, is discharged.

The first tube line 120 inserted into the groove line 111 is located at an inner wall of the groove line 111. The first tube line 120 is a component that is separate from the supporting member 110, and may be inserted into, or separated from, the supporting member 110. The first tube line 120 may correspond to the shape of the groove line 111. For example, the first tube line 120 may be formed in a lattice shape, and may be in complete contact with the inner wall of the groove line 111. The first tube line 120 may have a shape including an open upper portion. A slit line 121 is formed at the bottom of the first tube line 120, so that an internal space of the first tube line 120 and an internal space of the discharge line 113 can be connected to each other by the slit line 121.

The first tube line 120 may be made of a material that is relatively strong against heat so as to not be damaged by heat generated by laser, and may be made of a metallic material. For example, the first tube line 120 may be made of aluminum or aluminum alloy. However, the present disclosure is not limited thereto.

The plurality of dummy areas DA are areas between the plurality of cell areas CA. A dummy area DA may be between adjacent cell areas CA. The substrate 300 may be mounted on the stage 600 such that the plurality of cells correspond to the plurality of cell areas CA, and such that areas between the plurality of cells CE correspond to the plurality of dummy areas DA. The substrate 300 may be cut to include the plurality of cells CE and a portion between adjacent cells CE by a substrate-cutting process. The portion between two adjacent cells CE, which corresponds to the plurality of dummy areas DA, may be a portion removed by the substrate-cutting process. The plurality of dummy area DA may overlap with the groove line 111 between the plurality of cell areas CA. The plurality of dummy areas DA may extend in the same direction as the groove line 111.

The sub-tube line 623 is located in the plurality of dummy areas DA. The sub-tube line 623 is a component for adsorbing and fixing the substrate 300 mounted on the plurality of dummy areas DA. The sub-tube line 623 may correspond to the plurality of dummy areas DA. The groove line 111 may be between the plurality of cell areas CA, and the first tube line 120 may be located in the groove line 111. In addition, the sub-tube line 623 is located on or above the first tube line 120. The first tube line 120 and the sub-tube line 623 are spaced apart from each other with a sub-groove line 611 interposed therebetween.

The sub-tube line 623 includes a plurality of openings 615 and a communicating portion 616. The plurality of openings 615 are suction nozzles for adsorbing and fixing the substrate 300 mounted on the plurality of dummy area DA. The plurality of openings 615 may be formed at the top of the sub-tube line 623 along the extending line of the sub-tube line 623. The plurality of openings 615 are connected to the communicating portion 616 formed in the sub-tube line 623. The communicating portion 616 is a space that connects the plurality openings 615 and a suction unit. When the suction unit is driven, the suction force of the suction unit may be transferred to the bottom of the substrate 300 mounted on the dummy areas DA through the communicating portion 616 and the plurality of openings 615. Accordingly, the substrate 300 on the dummy areas DA can be adsorbed and fixed to the sub-tube line 623.

A plurality of sub-groove lines 611 are between the plurality of cell areas CA and the plurality of dummy areas DA. The plurality of sub-groove lines 611 are lines onto which the laser is irradiated. A laser module 200 of the substrate-cutting apparatus may irradiate the laser onto the plurality of sub-groove lines 611 of the stage 600. When the laser is irradiated onto the plurality of sub-groove lines, the substrate 300 may be cut into respective portions corresponding to the plurality of cell areas CA and the plurality of dummy areas DA.

A dummy area DA is between two adjacent cell areas CA, and two sub-groove lines 611 are between two adjacent cell areas CA. The dummy area DA and the cell area CA may be divided by the sub-groove line 611.

The plurality of sub-groove lines 611 may be connected to each other at the bottom of, or below, the sub-tube line 623. The sub-groove line 611 may extend along an outer side surface of the sub-tube line 623 and an inner side surface of the first tube line 120. The plurality of sub-groove lines 611, which extend in the extending direction of the sub-tube line 623 at both sides of the sub-tube line 623, may be connected to each other below, or at the bottom of, the sub-tube line 623. Also, the plurality of sub-groove lines 611 connected to each other may be connected to the discharge line 113 through the slit line 121. Accordingly, a foreign substance and a gas, which may be formed in the plurality of sub-groove lines 611, can be discharged to the suction unit through the slit line 121 and the discharge line 113.

The sub-tube line 623 and the first tube line 120 may be integrally provided. In the present embodiment, the sub-tube line 623 and the first tube line 120 are not separate components, but may be formed as one component. The sub-tube line 623 and the first tube line 120, which are formed as one component, may be inserted into the groove line 111 of the supporting member 110, and may thereafter be separated from the groove line 111. The sub-tube line 623 and the first tube line 120 may be integrally provided. However, the present disclosure is not limited thereto, and the sub-tube line 623 and the first tube line 120 may be separate components.

Meanwhile, the stage 600 and the substrate-cutting apparatus, which are shown in FIGS. 6 and 7, may further include the second tube line 522 described in FIG. 5. The second tube line 522 may be inserted into the discharge line 113 (e.g. may be inserted into the groove line 111 to define the discharge line 113), and may have a shape corresponding to an inner wall of the discharge line 113 to be in contact with an inner wall of the discharge line 113. The upper portion of the second tube line 522 may be open, and may be connected to the plurality of sub-groove lines 611 through the slit line 121. Accordingly, the foreign substance and the gas, which may be formed in the plurality of sub-groove lines 611, can be moved to the suction unit through the slit line 121 and the internal space of the second tube line 522. The stage 600 and the substrate-cutting apparatus may further include the second tube line 522, but the present disclosure is not limited thereto.

In the stage 600 and the substrate-cutting apparatus according to the present embodiment, the sub-tube line 623 is located in the dummy area DA, and the plurality of sub-groove lines 611 are located at both the sides of the sub-tube line 623. The laser module 200 may irradiate the laser onto the plurality of sub-groove lines 611. When the laser is irradiated onto the plurality of sub-groove lines 611, the substrate 300 may be cut into a respective portions corresponding to the plurality of dummy areas DA, the plurality of cell areas CA, and the plurality of edge areas EA.

A foreign substance may be stuck to an inner wall of the first tube line 120 or an outer wall of the sub-tube line 623 in the substrate-cutting process. To remove the stuck foreign substance, the first tube line 120 and the sub-tube line 623 may be separated from the supporting member 110. When there is a foreign substance formed in the plurality of sub-groove lines 611, a new sub-tube line 623 may be inserted into the discharge line 113 of the supporting member 110, and a new first tube line 120 may be inserted into the groove line 111. Therefore, the substrate-cutting process of the substrate-cutting apparatus is not stopped while the foreign substance formed in the plurality of sub-groove lines 611 is removed. Instead, the substrate-cutting process may be stopped for a time for which the first tube line 120 and the sub-tube line 623, in which the foreign substance exists, are replaced with a new first tube line 120 and a new sub-tube line 623. The time for which the first tube line 120 and the sub-tube line 623 are replaced with a new first tube line 120 and a new sub-tube line 623 may be remarkably shorter than an amount of time for the foreign substance formed in the plurality of groove lines to be removed from the supporting member.

Thus, the time for which the substrate-cutting process is stopped for removal of the foreign substrate can be reduced. Accordingly, in the stage 600 and the substrate-cutting apparatus according to the present embodiment, the rate at which the substrates 300 can be cut by the substrate-cutting apparatus can increase, and the efficiency of the substrate-cutting apparatus can be improved.

According to the present disclosure, a foreign substance formed at the stage of the substrate-cutting apparatus can be effectively removed. Also, the time required to remove a foreign substance formed at the stage of the substrate-cutting apparatus is reduced, so that the cutting rotational rate of a mother substrate can be improved.

Embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims, with functional equivalents thereof to be included therein.

What is claimed is:

1. A stage for cutting a substrate, the stage comprising:
a supporting member for having the substrate mounted thereon, the supporting member comprising a plurality of cell areas, and defining a groove line having a groove shape between the plurality of cell areas; and
a first tube line inserted into the groove line to contact an inner wall of the groove line, the first tube line having an open upper portion that extends a length of the first tube line.

2. The stage of claim 1, wherein the groove line and the first tube line have a lattice shape.

3. The stage of claim 1, wherein the first tube line is separable from the groove line.

4. The stage of claim 1, further comprising a discharge line connected to the groove line for discharging a foreign substance from the groove line through the discharge line,
wherein the first tube line has a shape corresponding to the groove line, and defines a slit line connecting an internal space of the first tube line and the discharge line.

5. The stage of claim 4, further comprising a second tube line having a shape corresponding to the discharge line, the second tube line being inserted into the discharge line.

6. The stage of claim 5, wherein an internal space of the second tube line is connected to the internal space of the first tube line through the slit line.

7. The stage of claim 5, wherein the second tube line is integrated with the first tube line.

8. The stage of claim 1, wherein the first tube line further comprises a coating layer on a surface contacting the supporting member, and
wherein a frictional coefficient between the coating layer and the supporting member is smaller than a frictional coefficient between the first tube line and the supporting member.

9. The stage of claim 8, wherein the coating layer comprises polytetrafluoroethylene (PTFE).

10. The stage of claim 1, wherein the first tube line comprises a metallic material.

11. A stage for cutting a substrate, the stage comprising:
a supporting member for having the substrate mounted thereon, the supporting member comprising a plurality of cell areas, and defining a groove line having a groove shape between the plurality of cell areas; and
a first tube line inserted into the groove line to contact an inner wall of the groove line, the first tube line having an open upper portion,
wherein the supporting member further comprises a plurality of dummy areas overlapping with the groove line between the plurality of cell areas, and
wherein the stage further comprises a sub-tube line corresponding to the plurality of dummy areas.

12. The stage of claim 11, further comprising a plurality of sub-groove lines extending in a same direction as the groove line between the plurality of dummy areas and the plurality of cell areas.

13. The stage of claim 12, wherein the plurality of sub-groove lines are connected to each other below the sub-tube line.

14. The stage of claim 12, wherein the sub-tube line comprises a plurality of openings for adsorbing the substrate.

15. The stage of claim 11, wherein the first tube line is integrated with the sub-tube line.

16. A substrate-cutting apparatus comprising:
a stage for cutting a substrate comprising a plurality of cells mounted on the stage; and
a laser module for separating the plurality of cells by irradiating laser onto the substrate,
wherein the stage comprises:
a supporting member having a plurality of cell areas, and defining a groove line having a groove shape between the plurality of cell areas; and a first tube line inserted into the groove line to contact an inner wall of the groove line, the first tube line having an open upper portion that extends a length of the first tube line.

17. The substrate-cutting apparatus of claim 16, wherein the stage further comprises a discharge line connected to the groove line for discharging a foreign substance from the groove line, and wherein the first tube line has a shape corresponding to the groove line, and defines a slit line connecting an internal space of the first tube line and the discharge line.

18. The substrate-cutting apparatus of claim 17, wherein the stage further includes a second tube line having a shape corresponding to the discharge line, and being inserted into the discharge line.

19. The substrate-cutting apparatus of claim 17, wherein the supporting member further comprises a plurality of dummy areas overlapping with the groove line between the plurality of cell areas, and wherein the stage further comprises a sub-tube line corresponding to the plurality of dummy areas.

\* \* \* \* \*